United States Patent
Lee

(10) Patent No.: US 8,084,804 B2
(45) Date of Patent: Dec. 27, 2011

(54) CAPACITOR WITH ZIRCONIUM OXIDE AND METHOD FOR FABRICATING THE SAME

(75) Inventor: Kee-jeung Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 62 days.

(21) Appl. No.: 12/607,943

(22) Filed: Oct. 28, 2009

(65) Prior Publication Data

US 2010/0084740 A1  Apr. 8, 2010

Related U.S. Application Data

(62) Division of application No. 12/546,603, filed on Aug. 24, 2009, which is a division of application No. 11/268,855, filed on Nov. 7, 2005, now Pat. No. 7,592,217.

(30) Foreign Application Priority Data

Nov. 8, 2004 (KR) .............................. 2004-0090418
Jun. 30, 2005 (KR) .............................. 2005-0057692

(51) Int. Cl.
*H01L 29/94* (2006.01)

(52) U.S. Cl. .. 257/310; 257/304; 257/311; 257/E27.086

(58) Field of Classification Search ................. 257/303, 257/306, 308–310, E27.086, E27.087, E27.088
See application file for complete search history.

(56) References Cited

U.S. PATENT DOCUMENTS

| | | | |
|---|---|---|---|
| 6,407,435 B1 * | 6/2002 | Ma et al. | |
| 6,570,253 B1 * | 5/2003 | Lim et al. | |
| 6,596,602 B2 * | 7/2003 | Iizuka et al. | |
| 6,627,503 B2 * | 9/2003 | Ma et al. | |
| 6,660,660 B2 * | 12/2003 | Haukka et al. | |
| 6,664,186 B1 * | 12/2003 | Callegari et al. | |
| 6,767,795 B2 | 7/2004 | Ahn et al. | |
| 6,774,050 B2 * | 8/2004 | Ahn et al. | |
| 6,787,863 B2 * | 9/2004 | Nakajima | |
| 6,797,525 B2 * | 9/2004 | Green et al. | |
| 6,875,678 B2 | 4/2005 | Jung et al. | |
| 6,903,398 B2 * | 6/2005 | Yamamoto | |

(Continued)

FOREIGN PATENT DOCUMENTS

CN  1391283 A  1/2003

(Continued)

OTHER PUBLICATIONS

Stesmans, A. et al.; "Paramagnetic defects in annealed ultrathin layers of $SiO_1$, $Al_2O_3$, and $ZrO_2$ on *(100)Si*"; vol. 85, No. 17; pp. 3792-3794; 2004 American Insititute of Physics.

*Primary Examiner* — Thanhha Pham
(74) *Attorney, Agent, or Firm* — Blakely, Sokoloff, Taylor & Zafman

(57) ABSTRACT

A capacitor with zirconium oxide and a method for fabricating the same are provided. The method includes: forming a storage node; forming a multi-layered dielectric structure on the storage node, the multi-layered dielectric structure including a zirconium oxide ($ZrO_2$) layer and an aluminum oxide ($Al_2O_3$) layer; and forming a plate electrode on the multi-layered dielectric structure.

20 Claims, 10 Drawing Sheets

U.S. PATENT DOCUMENTS

| | | | |
|---|---|---|---|
| 2002/0014647 A1* | 2/2002 | Seidi et al. |
| 2002/0021544 A1 | 2/2002 | Cho et al. |
| 2002/0106536 A1 | 8/2002 | Lee et al. |
| 2002/0135048 A1* | 9/2002 | Ahn et al. |
| 2002/0153579 A1* | 10/2002 | Yamamoto |
| 2002/0190294 A1* | 12/2002 | Iizuka et al. |
| 2003/0213987 A1* | 11/2003 | Basceri et al. |
| 2004/0048491 A1 | 3/2004 | Jung et al. |
| 2004/0104420 A1* | 6/2004 | Coolbaugh et al. |
| 2004/0141390 A1* | 7/2004 | Won et al. |
| 2004/0235242 A1* | 11/2004 | Basceri et al. |
| 2005/0051824 A1* | 3/2005 | Iizuka et al. |
| 2005/0054165 A1* | 3/2005 | Ahn et al. |

FOREIGN PATENT DOCUMENTS

| | | | |
|---|---|---|---|
| CN | 1469490 A | | 1/2004 |
| EP | 1 124 262 A2 | | 8/2001 |
| JP | 2001-267566 | | 9/2001 |
| JP | 2002-222934 | | 8/2002 |
| JP | 2002-314072 | | 10/2002 |
| JP | 2002-319583 | | 10/2002 |
| JP | 2002-373945 | | 12/2002 |
| KR | 10-2002-0002579 | | 1/2002 |
| KR | 10-2003-0003324 | | 1/2003 |
| KR | 10-2005-0075790 | * | 8/2005 |
| KR | 10-2005-0079599 | * | 8/2005 |
| KR | 10-2005-0102202 | * | 10/2005 |
| KR | 10-2005-0103065 | * | 10/2005 |
| KR | 10-2005-0123428 | * | 10/2005 |
| KR | 10-2005-0107399 | * | 11/2005 |
| KR | 10-0587086 | * | 5/2006 |
| KR | 1020060041355 A | * | 5/2006 |
| KR | 100596805 B1 | * | 6/2006 |
| KR | 10-0655139 | * | 12/2006 |
| KR | 10-0655140 | * | 12/2006 |
| KR | 10-0656283 | * | 12/2006 |
| KR | 10-2007-0000707 | * | 1/2007 |
| KR | 10-2007-0000759 | * | 1/2007 |
| KR | 10-2007-0002579 | * | 1/2007 |
| KR | 10-2007-0003031 | * | 1/2007 |
| KR | 10-0670726 | * | 1/2007 |
| KR | 10-0672766 | * | 1/2007 |
| TW | 452922 | | 9/2001 |
| TW | 506051 | | 10/2001 |
| TW | 577130 | | 2/2004 |

* cited by examiner

CAPACITOR WITH ZIRCONIUM OXIDE AND METHOD FOR FABRICATING THE SAME

CROSS-REFERENCE TO RELATED APPLICATION

The present patent application is a Divisional of application Ser. No. 12/546,603, filed Aug. 24, 2009, which application is a Divisional of application Ser. No. 11/268,855, filed Nov. 7, 2005, now U.S. Pat. No. 7,592,217, issued Sep. 22, 2009.

FIELD OF THE INVENTION

The present invention relates to a capacitor of a semiconductor device and a method for fabricating the same; and, more particularly, to a capacitor of a semiconductor device capable of securing an intended level of capacitance, a leakage current characteristic and thermal stability and a method for fabricating the same.

DESCRIPTION OF RELATED ARTS

As semiconductor devices have been highly integrated, sizes of unit cells have been greatly reduced and an operation voltage level has been lowered. Thus, a refresh time of a device has been shortened and a soft error had generated frequently. Hence, it is required to develop a capacitor which has a capacitance level greater than 25 fF per cell and is less likely to produce leakage current.

As known, the capacitor capacitance is proportional to the surface area of an electrode and a dielectric constant of a dielectric material and, is inversely proportional to the thickness of a dielectric material, which corresponds to a distance between the electrodes, more particularly, to an equivalent silicon oxide thickness (Tox) of a dielectric material. Thus, it is necessary to employ a dielectric material that has a high dielectric constant and can reduce the equivalent silicon oxide thickness (Tox) to fabricate a capacitor with a high capacitance level, which can be implemented suitably for highly integrated semiconductor devices.

It is limited to use a conventional nitride/oxide (NO) type capacitor for securing the high capacitance level required for highly integrated semiconductor devices. The conventional NO type capacitor generally employs a dielectric material of silicon nitride ($Si_3N_4$) whose dielectric constant is 7. Thus, a polysilicon-insulator-polysilicon (SIS) type capacitor has been proposed to secure a sufficient level of capacitance. The SIS type capacitor uses dielectric materials that have a dielectric constant higher than that of the silicon nitride. Examples of such dielectric materials are tantalum oxide ($Ta_2O_5$) whose dielectric constant is 25, lanthanum oxide ($La_2O_3$) whose dielectric constant is 30 and hafnium oxide ($HfO_2$) whose dielectric constant is 20.

However, the dielectric material of $Ta_2O_5$ is prone to leakage current and cannot reduce the equivalent silicon oxide thickness practically less than 30 Å due to an oxide layer formed during a thermal process. The dielectric materials of $La_2O_3$ and $HfO_2$ are advantageous on high capacitance because of their high dielectric constant values; however, $La_2O_3$ and $HfO_2$ frequently deteriorate durability of a capacitor since $La_2O_3$ and $HfO_2$ are very weak to repetitive electric shocks because of an increased level of leakage current and a decreased intensity level of breakdown voltage frequently occurring when the equivalent silicon oxide thickness is decreased to less than 15 Å. Especially, $HfO_2$ has a lower crystallization temperature than $Al_2O_3$ does. Thus, when $HfO_2$ is employed, leakage current increases abruptly while a thermal process is performed at temperature of higher than 600° C.

In the case of polysilicon commonly used as a dielectric material for the SIS type capacitor, polysilicon also has a limitation in securing a high level of conductivity required by highly integrated semiconductor devices. Hence, it has been attempted to use other metals with high conductivity as an electrode material.

As for capacitors which can implemented to a fabrication method of dynamic random access memory (DRAM) devices including micronized metal lines of less than 100 nm, capacitors with metal electrodes and dual or triple dielectric structures have been developed. For instance, a metal-insulator-polysilicon (MIS) type capacitor including a titanium nitride (TiN)-based electrode and a dual dielectric structure of $HfO_2/Al_2O_3$, and a metal-insulator-metal (MIM) type capacitor including a TiN-based electrode and a triple dielectric structure of $HfO_2/Al_2O_3/HfO_2$ have been developed.

However, it may be difficult to apply the conventional MIS or MIM type capacitor to devices with sub-70 nm metal lines. Since a multi-layered dielectric structure of the MIS or MIM type capacitor (e.g., $HfO_2/Al_2O_3$ or $HfO_2/Al_2O_3/HfO_2$) has the minimum equivalent silicon oxide thickness of 12 Å, it may be difficult to secure a capacitance level greater than 25 fF per cell in DRAM devices with sub-70 nm metal lines.

SUMMARY OF THE INVENTION

It is, therefore, an object of the present invention to provide a capacitor of a semiconductor device, wherein the capacitor can secure a leakage current characteristic and a capacitance level generally required by next generation semiconductor memory products with sub-70 nm metal lines, and a method for fabricating the same.

In accordance with an aspect of the present invention, there is provided a method for fabricating a capacitor, including: forming a storage node; forming a multi-layered dielectric structure on the storage node, the multi-layered dielectric structure including a zirconium oxide ($ZrO_2$) layer and an aluminum oxide ($Al_2O_3$) layer; and forming a plate electrode on the multi-layered dielectric structure.

In accordance with another aspect of the present invention, there is provided a method for fabricating a capacitor, including: forming a storage node; performing a plasma nitridation process on a surface of the storage node; forming a $ZrO_2$ layer on the nitrided storage node; performing a plasma nitridation process on a surface of the $ZrO_2$ layer, thereby obtaining a nitrided $ZrO_2$ layer; and forming a plate electrode on the nitrided $ZrO_2$ layer.

In accordance with still another aspect of the present invention, there is provided a method for fabricating a semiconductor device, including: forming a storage node; forming an $Al_2O_3$ layer on the storage node; forming a $ZrO_2$ layer on the $Al_2O_3$ layer; performing a plasma nitridation on a surface of the $ZrO_2$ layer, thereby obtaining a dielectric structure including a nitrided $ZrO_2$ layer and the $Al_2O_3$ layer; and forming a plate electrode on the dielectric structure.

In accordance with a further another aspect of the present invention, there is provided a method for fabricating a capacitor of a semiconductor device, including: forming a storage node; performing a plasma nitridation process on a surface of the storage node; sequentially forming a first $ZrO_2$ layer, an $Al_2O_3$ layer and a second $ZrO_2$ layer on the nitrided storage node; performing a plasma nitridation process on a surface of the second $ZrO_2$ layer, thereby obtaining a triple dielectric structure including the first $ZrO_2$ layer, the $Al_2O_3$ layer and the nitrided second $ZrO_2$ layer; and forming a plate electrode on the triple dielectric structure.

In accordance with a further aspect of the present invention, there is provided a capacitor of a semiconductor device, including: a storage node; a multi-layered dielectric structure including a $ZrO_2$ layer and an $Al_2O_3$ layer and formed on the storage node; and a plate electrode on the multi-layered dielectric structure.

In accordance with an even further aspect of the present invention, there is provided a capacitor of a semiconductor device, including: a storage node; a $ZrO_2$ layer formed on the storage node and including a plasma nitrided surface; and a plate electrode formed on the $ZrO_2$ layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A capacitor with zirconium oxide and a method for fabricating the same in accordance with exemplary embodiments of the present invention will be described in detail with reference to the accompanying drawings.

According to the exemplary embodiments of the present invention, a capacitor with a multi-layered dielectric structure including a plasma nitrided thin zirconium oxide ($ZrO_2$) or $ZrO_2$ layer and a thin aluminum oxide ($Al_2O_3$) layer is suggested to secure a sufficient capacitance level greater than approximately 30 fF per cell required by capacitors of sub-70 nm semiconductor memory devices, e.g., dynamic random access memory (DRAM) devices, a leakage current level less than approximately 0.5 fF per cell and a breakdown voltage level greater than approximately 2.0 V at the condition of approximately 1 pA per cell.

Generally, $ZrO_2$ has band gap energy (Eg) of approximately 7.8 eV and a dielectric constant of approximately 20 to approximately 25 higher than those of $Ta_2O_5$ and $HfO_2$. As a reference, $Ta_2O_5$ has band gap energy of approximately 4.5 eV and a dielectric constant of approximately 25, and $HfO_2$ has band gap energy of approximately 5.7 eV and a dielectric constant of approximately 20. $Al_2O_3$ whose band gap energy and dielectric constant is approximately 8.7 eV and approximately 9 has better thermal stability than $HfO_2$. Because of these characteristics of $ZrO_2$ and $Al_2O_3$, it is exemplified in the following exemplary embodiments of the present invention that a capacitor with a multi-layered dielectric structure including $ZrO_2$ and $Al_2O_3$ is advantageous on leakage current and thermal stability compared with a conventional capacitor with a dielectric structure including a single layer.

Hence, the above multi-layered dielectric structure can decrease the equivalent silicon oxide thickness to less than approximately 12 Å and thus, a capacitor with the above multi-layered dielectric structure can secure capacitance of greater than approximately 30 fF per cell in sub-70 nm DRAM devices.

Accordingly, the capacitor with the multi-layered dielectric structure can secure a sufficient capacitance level required by next generation DRAM products with sub-70 nm metal lines as well as leakage current and breakdown voltage characteristics which can be suitably maintained for mass-production.

After the deposition of the thin $ZrO_2$ layer and the thin $Al_2O_3$ layer, a low temperature annealing process is performed to improve layer properties, and a high temperature annealing process is performed to improve a crystallization characteristic. To prevent degradation of the leakage current characteristic, $Al_2O_3$, which has good thermal stability, is used together with a metal electrode.

Hereinafter, a method for fabricating a capacitor including a dielectric structure of $Al_2O_3/ZrO_2$ in accordance with a first embodiment of the present invention will be described in detail.

Figure 1A:
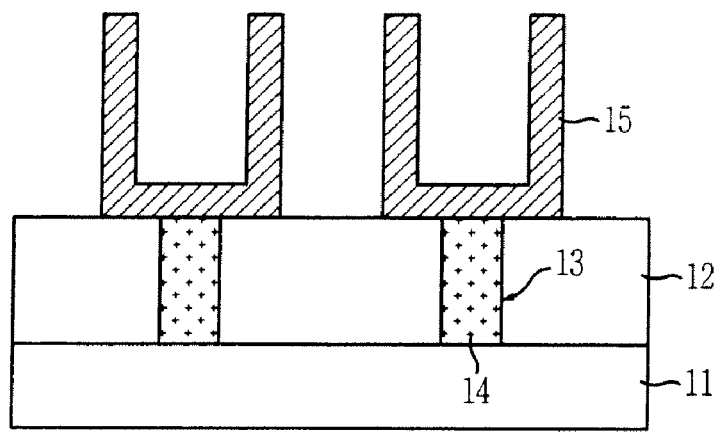
FIGS. 1A to 1C are cross-sectional views of a capacitor fabricated according to a first embodiment of the present invention for illustrating a method for fabricating the same.
Figure 1B:
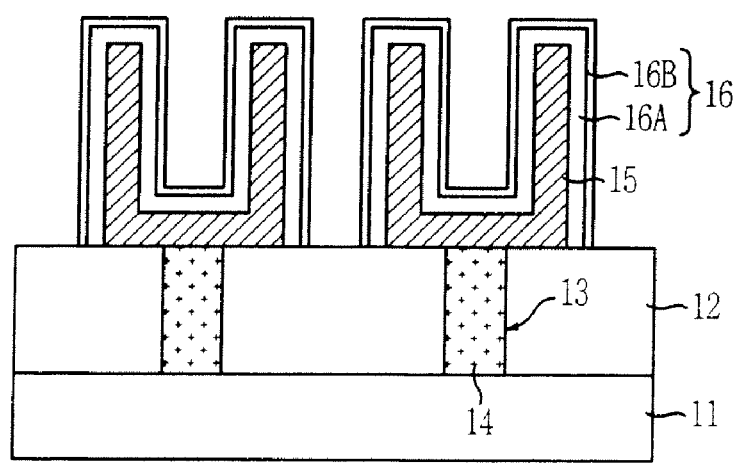
Figure 1C:
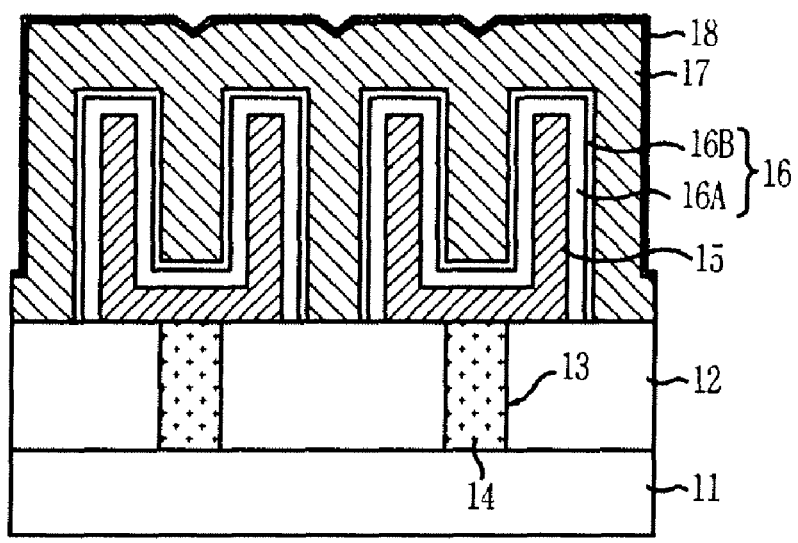

FIGS. 1A to 1C are cross-sectional views of a capacitor fabricated according to the first embodiment of the present invention for illustrating a fabrication method thereof.

Referring to FIG. 1A, although not illustrated, a substrate 11 is provided with bottom patterns including transistors and bit lines. An inter-layer insulation layer 12 is formed on the substrate 11 such that the inter-layer insulation layer 12 covers the bottom patterns.

The inter-layer insulation layer 12 is etched and a plurality of contact holes 13 exposing junction regions or landing plug polysilicon (LPP) regions are formed. A conductive material is filled into the plurality of contact holes 13, thereby obtaining a plurality of storage node contacts 14.

A layer of a storage node material is formed over the storage node contacts 14 and the inter-layer insulation layer 12. An isolation process including a chemical mechanical polishing (CMP) process or an etch-back process is performed on the layer of the storage node material to form storage nodes 15 individually connected with the storage node contacts 14. The storage nodes 15 include a material selected from the group consisting of doped polysilicon, titanium nitride (TiN), tantalum nitride (TaN), tungsten (W), tungsten nitride (WN), ruthenium (Ru), ruthenium oxide ($RuO_2$), iridium (Ir), iridium oxide ($IrO_2$), platinum (Pt), $Ru/RuO_2$, $Ir/IrO_2$, and $SrRuO_2$ and have a thickness of approximately 200 Å to approximately 500 Å. In addition to a cylinder structure, the storage nodes 15 can be formed in a concave structure or in a simple stack structure.

For instance, if the storage nodes 15 include TiN, titanium tetrachloride ($TiCl_4$) and ammonia ($NH_3$) are used as a source material and a reaction gas, respectively. The source material and the reaction gas flow in an amount of approximately 10 sccm to approximately 1,000 sccm. At this time, a chamber is maintained with a pressure of approximately 0.1 torr to approximately 10 torr and a substrate temperature of approximately 500° C. to approximately 700° C. The TiN layer is formed in a thickness of approximately 200 Å to approximately 500 Å.

Afterwards, a low temperature annealing process is performed in an atmosphere of a gas selected from the group consisting of nitrogen ($N_2$), hydrogen ($H_2$), $N_2/H_2$, $O_2$, $O_3$, and $NH_3$ to densify the storage nodes 15, remove impurities remaining inside the storage nodes 15, which become a cause for increasing leakage current, and eliminate surface roughness. Particularly, the smooth surface prevents electric fields from being concentrated at a certain region.

The low temperature annealing process is carried out by using one of a plasma, a furnace and a rapid thermal process (RTP). In the case of using the plasma, the low temperature annealing process is carried out for approximately 1 minutes to approximately 5 minutes under a certain recipe; that is, a plasma with a radio frequency (RF) power of approximately 100 W to approximately 500 W, a temperature of approximately 200° C. to approximately 500° C., a pressure of approximately 0.1 torr to approximately 10 torr, and approximately 5 sccm to approximately 5 slm of the selected ambient gas. In the case of using an electrical furnace, the low temperature annealing process is carried out at a temperature of approximately 600° C. to approximately 800° C. flowing approximately 5 sccm to approximately 5 slm of the selected ambient gas. In the case of using the RTP, the low temperature annealing process is carried out at a chamber maintained with a temperature of approximately 500° C. to approximately 800° C. and an ascending pressure of approximately 700 torr to approximately 760 torr or a descending pressure of approximately 1 torr to approximately 100 torr. At this time, the selected ambient gas flows in an amount of approximately 5 sccm to approximately 5 slm.

Referring to FIG. 1B, a multi-layered dielectric structure 16 including a thin $ZrO_2$ layer 16A and a thin $Al_2O_3$ layer 16B is formed on the storage nodes 15. The multi-layered dielectric structure 16 is formed by an atomic layer deposition (ALD) method. Detailed description of the ALD method will be described later with reference to FIG. 3.

Referring to FIG. 1C, a plate electrode 17 is formed on the multi-layered dielectric structure 16. The plate electrode includes a material selected from the group consisting of doped polysilicon, TiN, TaN, W, WN, Ru, $RuO_2$, Ir, $IrO_2$, Pt, $Ru/RuO_2$, $Ir/IrO_2$, and $SrRuO_3$. It is exemplified in the first embodiment of the present invention that the plate electrode 17 includes TiN and is formed by employing a chemical vapor deposition (CVD) process or a physical vapor deposition (PVD) process. For instance, the TiN deposition by the CVD process will be the following. A source material includes $TiCl_4$ and a reaction gas includes $NH_3$. The source material and the reaction gas flow in an amount of approximately 10 sccm to approximately 1,000 sccm. At this time, the CVD chamber is maintained with a pressure of approximately 0.1 torr to approximately 10 torr and a substrate temperature of approximately 500° C. to approximately 600° C. The TiN layer is deposited in a thickness of approximately 200 Å to approximately 400 Å.

After forming the plate electrode, a protection layer 18 is formed over the plate electrode by an ALD method. The protection layer 18 is one of an oxide layer including a material selected from the group consisting of $Al_2O_3$, hafnium oxide ($HfO_2$), tantalum oxide ($Ta_2O_5$), $ZrO_2$, titanium oxide ($TiO_2$), and lanthanum oxide ($La_2O_3$) or a metal layer including TiN. The protection layer 18 has a thickness of approximately 50 Å to approximately 200 Å.

Figure 2:
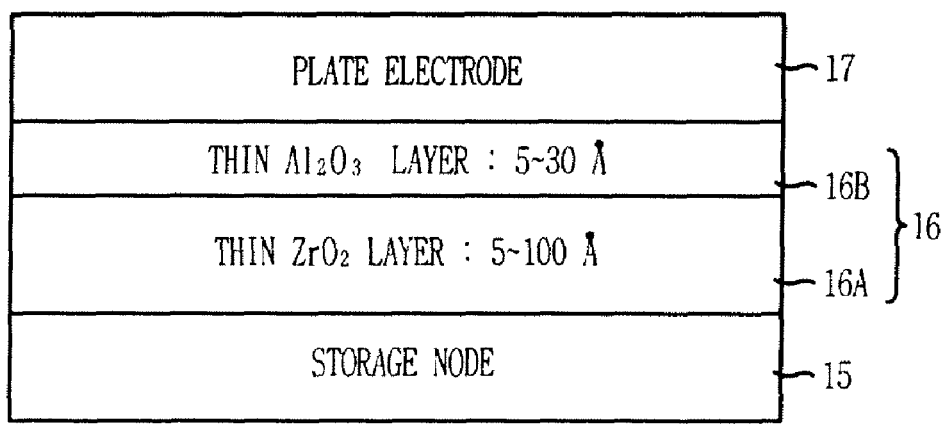
FIG. 2 is a diagram illustrating a capacitor structure in accordance with the first embodiment of the present invention.

FIG. 2 is a diagram illustrating the capacitor structure in accordance with the first embodiment of the present invention.

As illustrated, the multi-layered dielectric structure 16 is obtained by sequentially forming the thin $ZrO_2$ layer 16A and the thin $Al_2O_3$ layer 16B on the storage node 15, and the plate electrode 17 is formed on the multi-layered dielectric structure 16.

The $ZrO_2$ layer 16A has a thickness of approximately 5 Å to approximately 100 Å, and the $Al_2O_3$ layer 16B has a thickness of approximately 5 Å to approximately 30 Å. The total thickness of the multi-layered dielectric structure 16 ranges from approximately 10 Å to approximately 130 Å.

Figure 3:
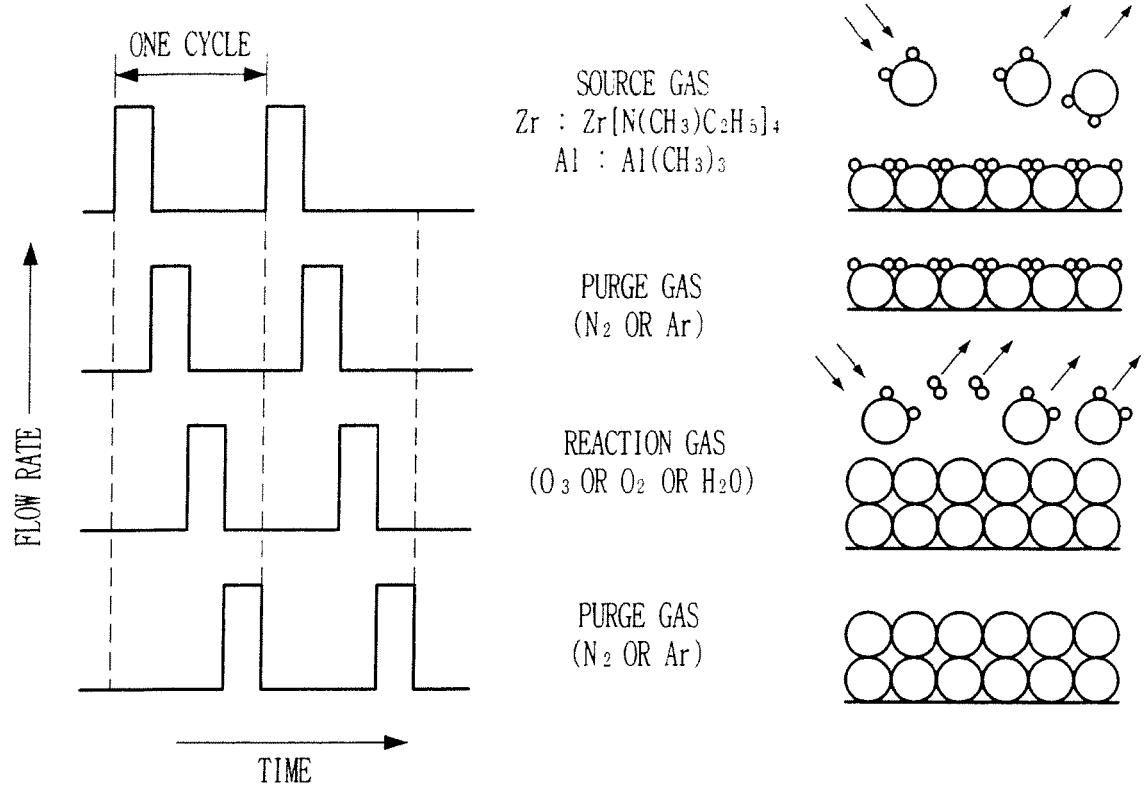
FIG. 3 is a diagram illustrating sequential steps of forming a multi-layered dielectric structure including a thin layer of zirconium oxide ($ZrO_2$) and a thin layer of aluminum oxide ($Al_2O_3$) on the basis of an atomic layer deposition (ALD) method.

FIG. 3 is a diagram illustrating sequential steps of forming a multi-layered dielectric structure including a thin $ZrO_2$ layer and a thin $Al_2O_3$ layer according to an ALD method.

As illustrated, the $ZrO_2$ layer and the $Al_2O_3$ layer are deposited through an ALD method, which performs a repetitive unit cycle until intended thicknesses of the above target layers are obtained. The unit cycle includes: supplying a source gas; supplying a purge gas; supplying a reaction gas; and supplying a purge gas. In more detail of the unit cycle, the source gas is supplied to a chamber and is adsorbed onto a target structure. Non-adsorbed portions of the source gas are purged out of the chamber, and the reaction gas is supplied to react with the adsorbed source gas, thereby depositing an intended thin layer. Afterwards, a purge gas is supplied to purge non-reacted portions of the reaction gas out of the chamber.

As for the $ZrO_2$ deposition, a unit cycle includes: supplying a source gas of Zr; supplying a purge gas; supplying a reaction gas; and supplying a purge gas. This unit cycle is repeated until an intended thickness of the $ZrO_2$ layer is obtained. At this time, the chamber is maintained with a pressure of approximately 0.1 torr to approximately 1 torr and a low substrate temperature of approximately 200° C. to approximately 350° C.

The Zr source gas is selected from the group consisting of $ZrCl_4$, $Zr(N(CH_3)C_2H_5)_4$, $Zr(O-tBu)_4$, $Zr(N(CH_3)_2)_4$, $Zr(N(C_2H_5)(CH_3))_4$, $Zr(N(C_2H_5)_2)_4$, $Zr(TMHD)_4$, $Zr(OiC_3H_7)_3$ (TMTD), and $Zr(OtBu)_4$ and is adsorbed onto a target structure as the Zr source gas is supplied to the chamber. At this time, the Zr source gas is supplied to the chamber with an aid of helium (He) gas serving as a carrier gas. The Ar gas flows in an amount of approximately 150 sccm to approximately 250 sccm for approximately 0.1 seconds to approximately 10 seconds.

Next, a purge gas including nitrogen ($N_2$) gas or argon (Ar) gas flows into the chamber to purge non-adsorbed portions of the Zr source gas out of the chamber. The purge gas flows in an amount of approximately 200 sccm to approximately 400 sccm for approximately 3 seconds to approximately 10 seconds.

A reaction gas selected from the group consisting of ozone ($O_3$), oxygen ($O_2$), $O_2$ plasma, nitrogen oxide ($N_2O$), $N_2O$ plasma, and water ($H_2O$) vapor flows into the chamber and reacts with the adsorbed Zr source gas, thereby depositing the thin $ZrO_2$ layer. The reaction gas flows in an amount of approximately 0.1 slm to approximately 1 slm for approximately 3 seconds to approximately 10 seconds. If the reaction gas is $O_3$ gas of which concentration ranges from approximately 100 gcm$^{-3}$ to approximately 500 gcm$^{-3}$, the $O_3$ gas flows in an amount of approximately 200 sccm to approximately 500 sccm.

A purge gas including $N_2$ gas or Ar gas flows into the chamber to purge non-reacted portions of the reaction gas out of the chamber. The purge gas flows in an amount of approximately 50 sccm to approximately 200 sccm for approximately 3 seconds to approximately 10 seconds.

The above unit cycle is repeated until the thickness of the $ZrO_2$ layer is in a range from approximately 5 Å to approximately 100 Å.

After the $ZrO_2$ deposition, the $Al_2O_3$ deposition is instigated, and a unit cycle of the $Al_2O_3$ deposition includes: supplying a source gas of Al; supplying a purge gas; supplying a reaction gas; and supplying a purge gas. This unit cycle is repeated until an intended thickness of the $Al_2O_3$ layer is obtained. At this time, the chamber is maintained with a pressure of approximately 0.1 torr to approximately 1 torr and a low substrate temperature of approximately 200° C. to approximately 500° C.

The Al source gas selected from the group consisting of $Al(CH_3)_3$, $Al(C_2H_5)_3$ and other Al-containing organic metal compounds is adsorbed onto a target structure as the Al source gas is supplied to the chamber for the ALD method. At this time, the Al source gas is supplied to the chamber with an aid of helium (He) gas serving as a carrier gas. The Ar gas flows in an amount of approximately 20 sccm to approximately 100 sccm for approximately 0.1 seconds to approximately 5 seconds.

Next, a purge gas including $N_2$ gas or Ar gas flows into the chamber to purge non-adsorbed portions of the Al source gas out of the chamber. The purge gas flows in an amount of approximately 50 sccm to approximately 300 sccm for approximately 0.1 seconds to approximately 5 seconds.

A reaction gas selected from the group consisting of $O_3$, $O_2$, $O_2$ plasma, $N_2O$, $N_2O$ plasma, and $H_2O$ vapor flows in the chamber and reacts with the adsorbed Al source gas, thereby depositing the thin $Al_2O_3$ layer. The reaction gas flows in an amount of approximately 0.1 slm to approximately 1 slm for approximately 3 seconds to approximately 10 seconds. If the reaction gas is $O_3$ gas of which concentration ranges from approximately 100 gcm$^{-3}$ to approximately 500 gcm$^{-3}$, the $O_3$ gas flows in an amount of approximately 200 sccm to approximately 500 sccm.

A purge gas including $N_2$ gas or Ar gas flows into the chamber to purge non-reacted portions of the reaction gas out of the chamber. The purge gas flows in an amount of approximately 300 sccm to approximately 1,000 sccm for approximately 0.1 seconds to approximately 10 seconds.

The above unit cycle is repeated until the thickness of the $Al_2O_3$ layer is in a range from approximately 5 Å to approximately 30 Å.

After the deposition of the $ZrO_2$ layer and the $Al_2O_3$ layer in-situ, a low temperature annealing process is performed to remove impurities such as carbon and hydrogen and eliminate defects like oxygen apertures and surface roughness, so that leakage current and breakdown voltage characteristics of the aforementioned thin layers can be improved. The low temperature annealing process employs one of a plasma annealing process and ultraviolet (UV)/$O_3$ annealing process.

The plasma annealing process is performed at a temperature ranging from approximately 300° C. to approximately 450° C. in an atmosphere of a gas selected from the group consisting of $N_2$, He, $N_2/H_2$, $NH_3$, $N_2O$, $N_2/O_2$, $O_2$, and $O_3$. The selected gas flows in an amount of approximately 100 sccm to approximately 200 sccm for approximately 30 seconds to approximately 120 seconds along with using a plasma with a RF power ranging from approximately 50 W to approximately 300 W and a pressure of approximately 0.1 torr to approximately 1 torr. The UV/$O_3$ annealing process is performed at a temperature ranging from approximately 300° C. to approximately 400° C. for approximately 2 minutes to approximately 10 minutes with an intensity of approximately 1530 mWcm$^{-2}$.

Afterwards, a high temperature annealing process is performed to increase dielectric constants of the $ZrO_2$ layer and the $Al_2O_3$ layer. The high temperature annealing process is carried out in an atmosphere of a gas selected from the group consisting of N, Ar and He by employing one of a rapid thermal annealing process and a furnace annealing process. The rapid thermal annealing process is carried out at a temperature of approximately 500° C. to approximately 800° C. within a chamber set with either an ascending pressure of approximately 700 torr to approximately 760 torr or a descending pressure of approximately 1 torr to approximately 100 torr. The selected gas flows in an amount of approximately 5 sccm to approximately 5 slm for approximately 30 seconds to approximately 120 seconds. The furnace annealing process is performed at a temperature of approximately 600° C. to approximately 800° C. for approximately 10 minutes to approximately 30 minutes along with the selected gas flowing in an amount of approximately 5 sccm to approximately 5 slm.

The low temperature annealing process including the plasma annealing process or the UV/$O_3$ annealing process and the high temperature annealing process including the rapid thermal annealing process or the furnace annealing process can be performed after a plate electrode is formed.

Figure 4:
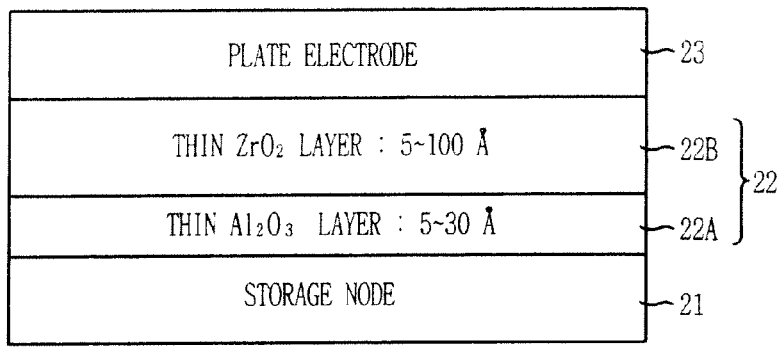
FIG. 4 is a diagram illustrating a capacitor structure in accordance with a second embodiment of the present invention.

FIG. 4 is a diagram illustrating a capacitor structure in accordance with a second embodiment of the present invention.

The capacitor structure includes: a storage node 21; a multi-layered dielectric structure 22; and a plate electrode 23. Different from the first embodiment, the multi-layered dielectric structure 22 in the second embodiment has a structure of $ZrO_2/Al_2O_3$ obtained by sequentially stacking an $Al_2O_3$ layer 22A and a $ZrO_2$ layer 22B. The $ZrO_2$ layer 22B has a thickness of approximately 5 Å to approximately 100 Å, while the $Al_2O_3$ layer 22A has a thickness of approximately 5 Å to approximately 30 Å.

Figure 5:
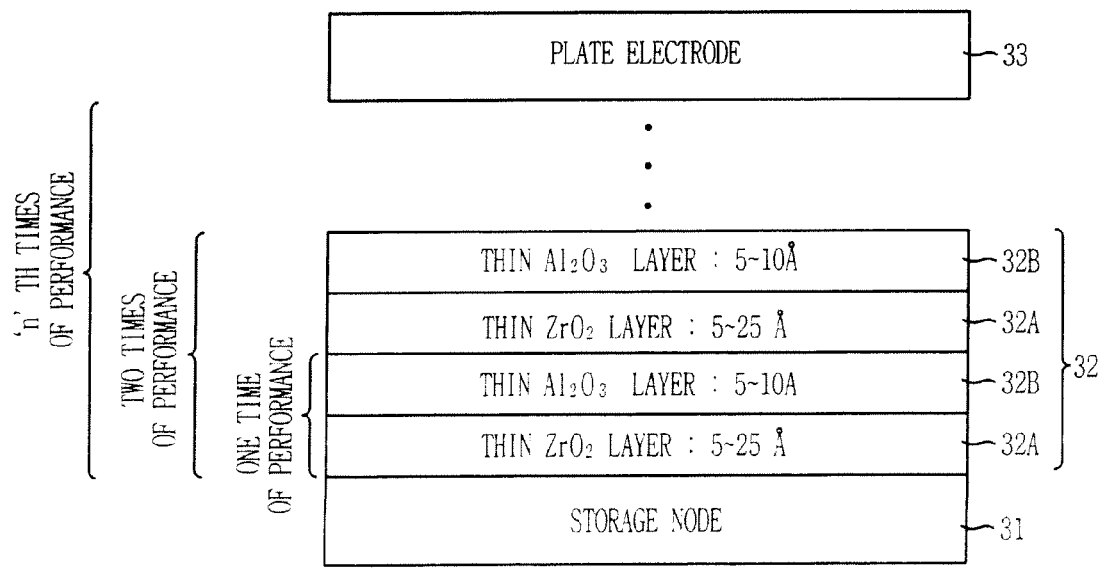
FIG. 5 is a diagram illustrating a capacitor structure in accordance with a third embodiment of the present invention.

FIG. 5 is a diagram illustrating a capacitor structure in accordance with a third embodiment of the present invention.

The capacitor structure includes: a storage node 31; a multi-layered dielectric structure 32; and a plate electrode 33. The multi-layered dielectric structure 32 has a structure of $(Al_2O_3/ZrO_2)_n$, where $2 \leq n \leq 10$, wherein the alternating sequential deposition of a $ZrO_2$ layer 32A and an $Al_2O_3$ layer 32B is repeated at least more than two times. Herein, 'n' is the number of deposition of each thin layer. The $ZrO_2$ layer 32A has a thickness of approximately 5 Å to approximately 25 Å, while the $Al_2O_3$ layer 32B has a thickness of approximately 5 Å to approximately 10 Å.

Figure 6:
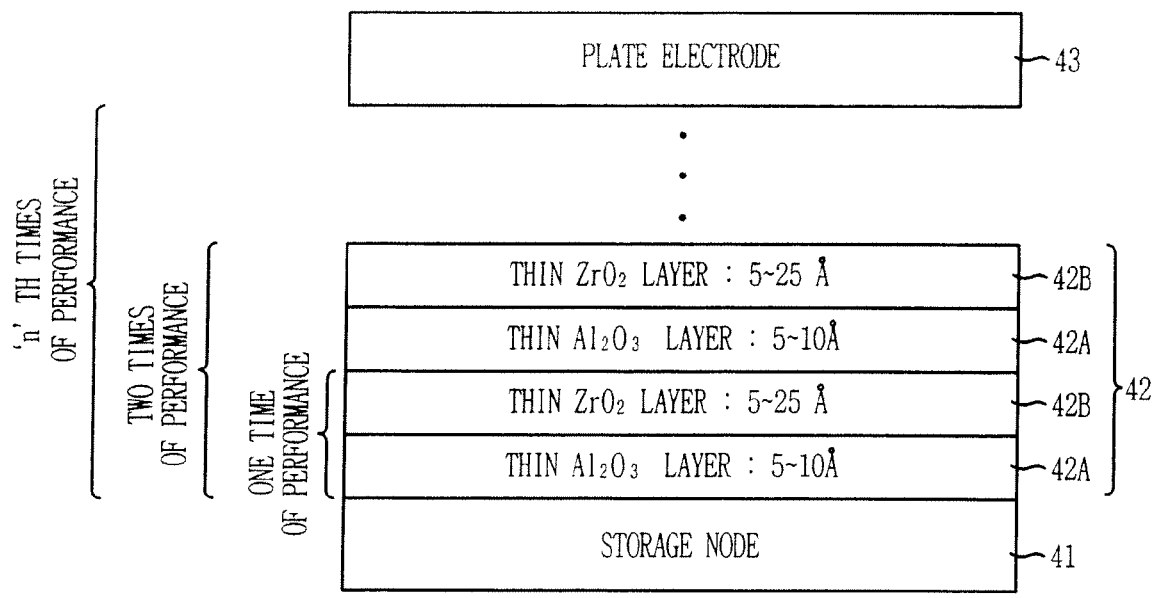
FIG. 6 is a diagram illustrating a capacitor structure in accordance with a fourth embodiment of the present invention.

FIG. 6 is a diagram illustrating a capacitor structure in accordance with a fourth embodiment of the present invention.

The capacitor structure includes: a storage node 41; a multi-layered dielectric structure 42; and a plate electrode 43. The multi-layered dielectric structure 42 has a structure of $(ZrO_2/Al_2O_3)_n$, where $2 \leq n \leq 10$, wherein the alternating sequential deposition of an Al$_2$O$_3$ layer 42A and a ZrO$_2$ layer 42B is repeated at least more than two times. Herein, 'n' is the number of deposition of each thin layer. The ZrO$_2$ layer 42B has a thickness of approximately 5 Å to approximately 25 Å, while the Al$_2$O$_3$ layer 42A has a thickness of approximately 5 Å to approximately 10 Å.

Figure 7:
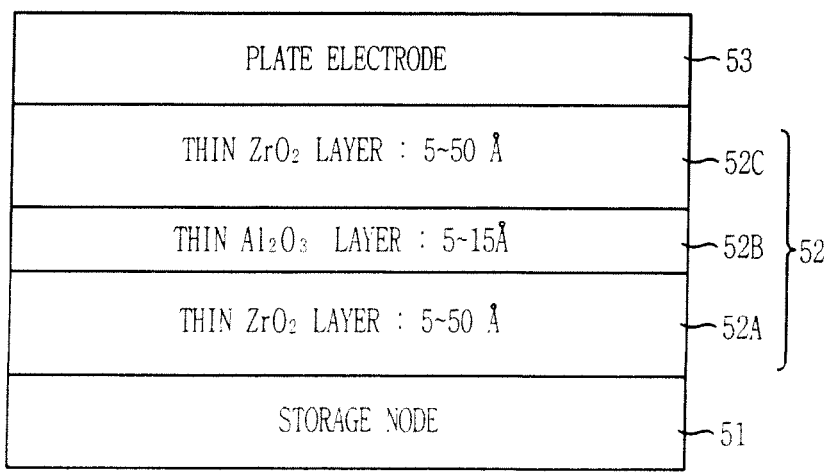
FIG. 7 is a diagram illustrating a capacitor structure in accordance with a fifth embodiment of the present invention.

FIG. 7 is a diagram illustrating a capacitor structure in accordance with a fifth embodiment of the present invention.

The capacitor structure includes: a storage node 51; a multi-layered dielectric structure 52; and a plate electrode 53. The multi-layered dielectric structure 52 has a triple-layer structure of ZrO$_2$/Al$_2$O$_3$/ZrO$_2$, wherein a first ZrO$_2$ layer 52A, an Al$_2$O$_3$ layer 52B and a second ZrO$_2$ layer 52C are sequentially stacked. The first ZrO$_2$ layer 52A and the second ZrO$_2$ layer 52C has a thickness of approximately 5 Å to approximately 50 Å, and the Al$_2$O$_3$ layer 52B has a thickness of approximately 5 Å to approximately 15 Å.

As illustrated in FIGS. 4 to 7, the thin Al$_2$O$_3$ layer and the thin ZrO$_2$ layer are deposited by employing the ALD method, and the source gas, the purge gas and the reaction gas for depositing the thin Al$_2$O$_3$ layer and the thin ZrO$_2$ layer are used identically to those gases described in the first embodiment.

Preferably, the Zr source gas is selected from the group consisting of ZrCl$_4$, Zr(N(CH$_3$)C$_2$H$_5$)$_4$, Zr(O-tBu)$_4$, Zr(N(CH$_3$)$_2$)$_4$, Zr(N(C$_2$H$_5$)(CH$_3$))$_4$, Zr(N(C$_2$H$_5$)$_2$)$_4$, Zr(TMHD)$_4$, Zr(OiC$_3$H$_7$)$_3$(TMTD, and Zr(OtBu)$_4$. The purge gas includes N$_2$ gas or Ar gas and the reaction gas is selected from the group consisting of O$_3$, O$_2$, O$_2$ plasma, N$_2$O, N$_2$O plasma, and H$_2$O vapor. The Al source gas is selected from the group consisting of Al(CH$_3$)$_3$, Al(C$_2$H$_5$)$_3$ and other Al-containing organic metal compounds.

After the deposition of the ZrO$_2$ layer and the Al$_2$O$_3$ layer in-situ according to the ALD method, a low temperature annealing process is performed to remove impurities such as carbon and hydrogen and eliminate defects like oxygen apertures and surface roughness, so that leakage current and breakdown voltage characteristics of the aforementioned thin layers can be improved. A high temperature annealing process is then performed to increase dielectric constants of the aforementioned thin layers. Recipes for the low temperature annealing process and the high temperature annealing process will be the same as described in the first embodiment of the present invention.

The capacitor structures according to the first embodiment to the fifth embodiment includes a multi-layered dielectric structure including the ZrO$_2$ layer, which has high band gap energy of approximately 7.8 eV and a dielectric constant of approximately 20 to approximately 25, and the Al$_2$O$_3$ layer, which has good thermal stability, band gap energy of approximately 8.7 eV and a dielectric constant of approximately 9. As a result of this specific multi-layered dielectric structure, it is possible to prevent a generation of leakage current and increase a breakdown voltage value. Also, a high level of capacitance can also be secured. Therefore, it is possible to realize capacitors which can have a sufficient capacitance level required by highly integrated memory products with sizes of less than approximately 70 nm and have improved leakage current and breakdown voltage characteristics.

Since the above multi-layered dielectric structure has good thermal stability compared with a dielectric structure including a single dielectric layer such as an HfO$_2$ layer, electric characteristics are less likely to be deteriorated even during a high temperature process required to be performed in integration processes after the capacitor formation. Accordingly, it is possible to improve durability and reliability of capacitors in next generation semiconductor memory devices implemented with sub-70 nm metal lines.

Figure 8A:
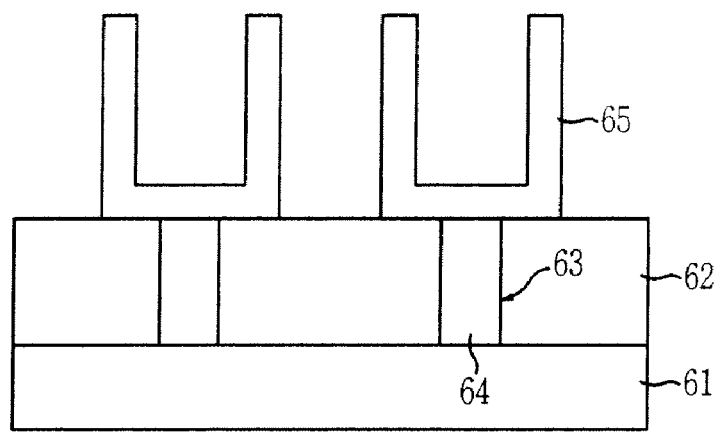
FIGS. 8A to 8C are cross-sectional views of a capacitor fabricated according to a sixth embodiment of the present invention for illustrating a method for fabricating the same.
Figure 8B:
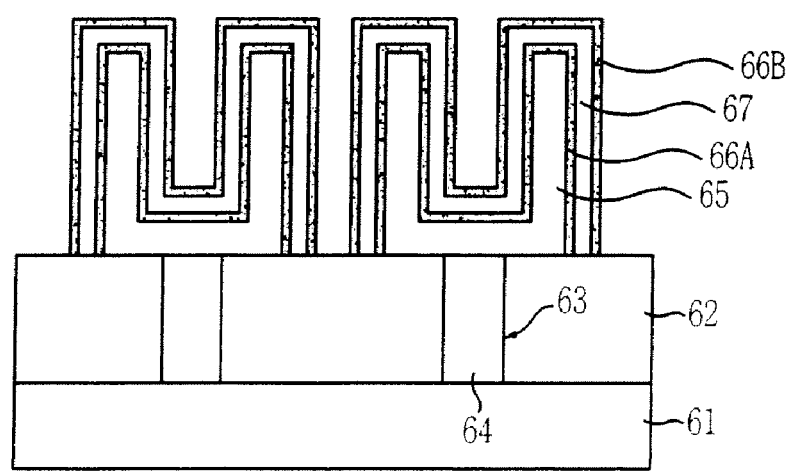
Figure 8C:
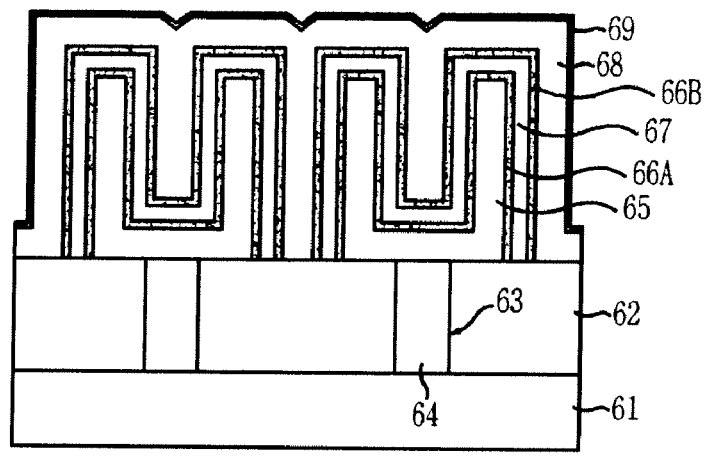
Figure 8D:
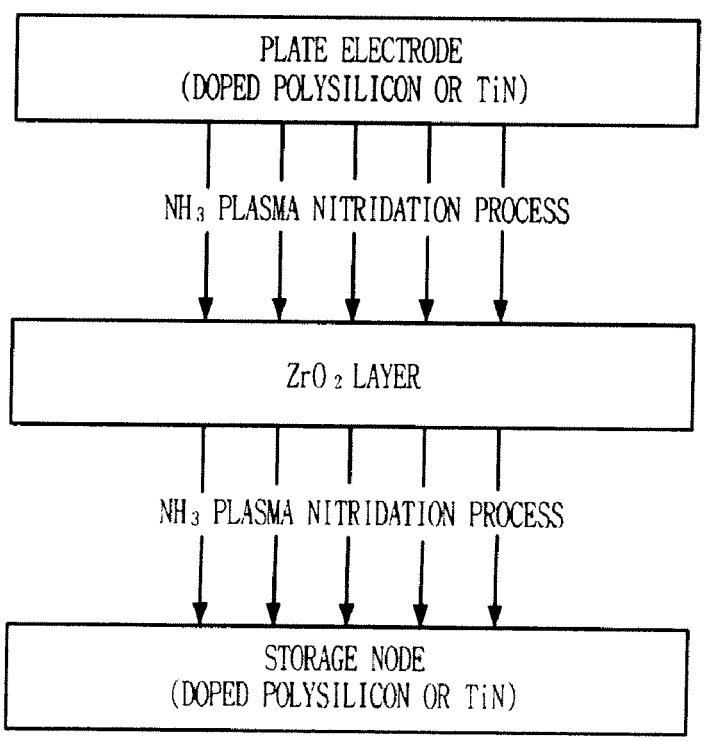
FIG. 8D is a diagram illustrating sequential steps of fabricating a capacitor in accordance with the sixth embodiment of the present invention.

FIGS. 8A to 8C are cross-sectional views of a capacitor fabricated according to a sixth embodiment of the present invention for illustrating a method for fabricating the same. FIG. 8D is a diagram briefly illustrating sequential steps of a method for fabricating the capacitor according to the sixth embodiment of the present invention.

Referring to FIG. 8A, an inter-layer insulation layer 62 is formed on a substrate 61 on which bottom patterns (not shown) including transistors and bit lines are formed. The inter-layer insulation layer 62 is etched to form a plurality of contact holes 63 exposing junction regions or LPP regions. A conductive material is then filled into the contact holes 63, thereby forming storage node contacts 64. A layer of a storage node material is formed over the inter-layer insulation layer 62 and the storage node contacts 64, and an isolation process employing a CMP process or an etch-back process is performed to form storage nodes 65 individually contacting the storage node contacts 64.

The storage nodes 65 include a material selected from the group consisting of doped polysilicon, TiN, TaN, W, WN, Ru, RuO$_2$, Ir, IrO$_2$, Pt, Ru/RuO$_2$, Ir/IrO$_2$, and SrRuO$_3$ and have a thickness ranging from approximately 200 Å to approximately 500 Å. Also, the storage nodes 65 can be formed in a cylinder structure, a concave structure or a simple stack structure.

For instance, if the storage nodes 65 include TiN, TiCl$_4$ and NH$_3$ are used as a source material and a reaction gas, respectively. The source material and the reaction gas flow in an amount of approximately 10 sccm to approximately 1,000 sccm. At this time, a chamber is maintained with a pressure of approximately 0.1 torr to approximately 10 torr and a substrate temperature of approximately 500° C. to approximately 700° C. The TiN layer is formed in a thickness of approximately 200 Å to approximately 400 Å.

Afterwards, a low temperature annealing process is performed in an atmosphere of a gas selected from the group consisting of N$_2$, H$_2$, N$_2$/H$_2$, O$_2$, O$_3$, and NH$_3$ to densify the storage nodes 65, remove impurities remaining inside the storage nodes 65, which become a cause for increasing leakage current, and eliminate surface roughness. Particularly, the smooth surface prevents electric fields from being concentrated at a certain region.

The low temperature annealing process is carried out by using one of a plasma, a furnace and a RTP. In the case of using the plasma, the low temperature annealing process is carried out for approximately 1 minutes to approximately 5 minutes under a certain recipe; a plasma with a radio frequency (RF) power of approximately 100 W to approximately 500 W, a temperature of approximately 200° C. to approximately 500° C., a pressure of approximately 0.1 torr to approximately 10 torr, and approximately 5 sccm to approximately 5 slm of the selected ambient gas. In the case of using an electrical furnace, the low temperature annealing process is carried out at a temperature of approximately 600° C. to approximately 800° C. flowing approximately 5 sccm to approximately 5 slm of the selected ambient gas. In the case of using the RTP, the low temperature annealing process is carried out at a chamber maintained with a temperature of approximately 500° C. to approximately 800° C. and an ascending pressure of approximately 700 torr to approximately 760 torr or a descending pressure of approximately 1 torr to approximately 100 torr. At this time, the selected ambient gas of approximately 5 sccm to approximately 5 slm flows into the chamber.

Referring to FIG. 8B, surfaces of the storage nodes 65 are nitrided using a plasma, and then, approximately 30 Å to approximately 100 Å of a thin $ZrO_2$ layer 67 is deposited on the storage nodes 65. A surface of the $ZrO_2$ layer 67 is nitrided using a plasma. Hence, a first plasma nitride layer 66A exists beneath the thin $ZrO_2$ layer 67 and, as described above, is formed by nitriding the surfaces of the storage nodes 65. On the other hand, a second plasma nitride layer 66B exist on top of the thin $ZrO_2$ layer 67 and, as described above, is formed by nitriding the surface of the thin $ZrO_2$ layer 67.

The reason for forming the first plasma nitride layer 66A and the second plasma nitride layer 66B is to secure thermal stability of the $ZrO_2$ layer 67 and prevent penetration of impurities into the $ZrO_2$ layer 67. The aforementioned plasma nitridation process is carried out under a specific recipe; that is, a temperature of approximately 200° C. to approximately 500° C., a pressure of approximately 0.1 torr to approximately 10 torr, an ambient gas selected from the group consisting of $NH_3$, $N_2$ and $N_2/H_2$, and a RF power of approximately 100 W to approximately 500 W. The plasma nitridation process is carried out at the chamber in which glow discharge is generated for approximately 5 seconds to approximately 300 seconds.

In the case that the plasma nitridation process is performed before and after the deposition of the $ZrO_2$ layer 67, it is possible to prevent a diffusion of impurities, which is a source for the leakage current, from a subsequent plate electrode to the $ZrO_2$ layer 67. Especially, the plasma nitridation process induces a formation of Zr—O—N bonds on top and bottom of the $ZrO_2$ layer 67 to thereby increase a crystallization temperature of the $ZrO_2$ layer 67. As a result, the crystallization does not take place even if a high temperature process is performed at above approximately 600° C., further providing effects of preventing a generation of leakage current and increasing breakdown voltage of the dielectric structures of the capacitors.

After the plasma nitridation process, an annealing process employing a RTP or a furnace is performed with controlling a nitrogen concentration accumulated on the surface of the $ZrO_2$ layer 67, so that electric characteristics of the capacitors can be adjusted. The annealing process is performed at approximately 600° C. to approximately 900° C. in an ascending or descending pressure state.

In addition to the ALD method as described in FIG. 3, the thin $ZrO_2$ layer 67 can be deposited through employing a metal organic chemical vapor deposition (MOCVD) method or a pulsed CVD method.

As for the $ZrO_2$ deposition according to the ALD method, a unit cycle includes: supplying a source gas of Zr; supplying a purge gas; supplying a reaction gas; and supplying a purge gas. This unit cycle is repeated until an intended thickness of the $ZrO_2$ layer is obtained. At this time, the chamber is maintained with a pressure of approximately 0.1 torr to approximately 1 torr and a low substrate temperature of approximately 200° C. to approximately 350° C.

The Zr source gas is selected from the group consisting of $ZrCl_4$, $Zr(N(CH_3)C_2H_5)_4$ and other Zr-containing organic metal compounds and is transported by a carrier gas such as Ar gas. The Ar gas flows in an amount of approximately 150 sccm to approximately 250 sccm for approximately 0.1 seconds to approximately 10 seconds. The Zr source gas flows in an amount of approximately 50 sccm to approximately 500 sccm.

The reaction gas is selected from the group consisting of $O_3$, $O_2$ and $H_2O$ vapor, and the purge gas includes $N_2$ gas or Ar gas. The selected $O_3$ gas has a concentration of approximately $200\pm20$ $gcm^{-3}$. The reaction gas flows in an amount of 0.1 slm to approximately 1 slm for approximately 3 seconds to approximately 10 seconds. Instead of using $H_2O$ vapor, heavy water ($D_2O$) can be used to eliminate a charge trapping event caused by weak hydrogen bonds within the $ZrO_2$ layer 67. The heavy water ($D_2O$) results in formation of an insulation layer, e.g., a metal oxide layer, which have deuterium bonds instead of hydrogen bonds. In this case, reliability of the dielectric layer can be improved. Also, in addition to $H_2O$ vapor and heavy water, the reaction gas can include $O_3$, $O_2$, $O_2$ plasma, $N_2O$, or $N_2O$ plasma.

After the Zr source gas flows into the chamber, the purge gas flows in an amount of approximately: 200 sccm to approximately 400 sccm, or after the reaction gas flows into the chamber, the purge gas flows in an amount of approximately 50 sccm to approximately 200 sccm. In both of the cases, the purge gas flows for approximately 3 seconds to approximately 10 seconds.

Referring to FIG. 8C, a plate electrode 68 is formed on the thin $ZrO_2$ layer 67 subjected to the plasma nitridation process before and after the $ZrO_2$ deposition. The plate electrode 68 includes a material selected from the group consisting of doped polysilicon, TiN, TaN, W, WN, WSi, Ru, $RuO_2$, Ir, $IrO_2$, and Pt. Particularly, in the case that the plate electrode 68 is formed of a metal, a silicon nitride layer or a polysilicon layer is formed over the plate electrode 68 as a protection layer 69 for improving structural stability of the capacitors against humidity, temperature or electrical shocks. At this time, the protection layer 69 is formed in a thickness of 200 Å to approximately 1,000 Å.

In the sixth embodiment of the present invention, as mentioned above, the plasma nitridation process is performed before and after the $ZrO_2$ layer 67 is deposited to induce creation of Zr—O—N bonds on the surface of the $ZrO_2$ thin layer 67. As a result, a crystallization temperature is increased and diffusion of remaining impurities can be blocked. That is, to overcome the limitation in thermal stability of the $ZrO_2$ layer, i.e., low crystallization temperature, after the $ZrO_2$ layer 67 is deposited, the plasma nitridation process is performed on the surface of the $ZrO_2$ layer 67, inducing Zr—O—N bonds by causing nitrogen to combine with the $ZrO_2$ layer 67. As a result, it is possible to increase the crystallization temperature of the $ZrO_2$ layer 67 and prevent diffusion of remaining impurities from the plate electrode 68 or storage nodes 65 to the $ZrO_2$ layer 67.

Accordingly, according to the sixth embodiment of the present invention, the leakage current characteristic of the $ZrO_2$ layer 67 can be improved and the breakdown voltage of the $ZrO_2$ layer 67 can be increased, so that the $ZrO_2$ layer 67 can have structural stability. By employing the nitrided $ZrO_2$ layer as the dielectric layer of the capacitor, a sufficient capacitance level and an intended leakage current can be secured. Therefore, the capacitor fabricated according to the sixth embodiment can be applied to sub-70 nm memory products.

Instead of employing a single layer of the $ZrO_2$ layer 67 for the dielectric structure of the capacitor, it is possible to implement a dual dielectric structure including a nitrided $Al_2O_3$ layer and a nitrided $ZrO_2$ layer, another dual dielectric structure including an $Al_2O_3$ layer and a nitrided $ZrO_2$ layer, a triple dielectric structure including a $ZrO_2$ layer, an $Al_2O_3$ layer, a nitrided $ZrO_2$ layer, another triple dielectric structure including a nitrided $ZrO_2$ layer, an $Al_2O_3$ layer and a nitrided $ZrO_2$ layer, and a further another triple dielectric structure including a nitrided $ZrO_2$ layer, a nitrided $Al_2O_3$ layer and a nitride $ZrO_2$ layer. These dual or triple dielectric structures including the nitrided $ZrO_2$ layer can have the same effect to the case of employing the single layer of the nitrided $ZrO_2$ layer as the dielectric structure.

Figure 9:
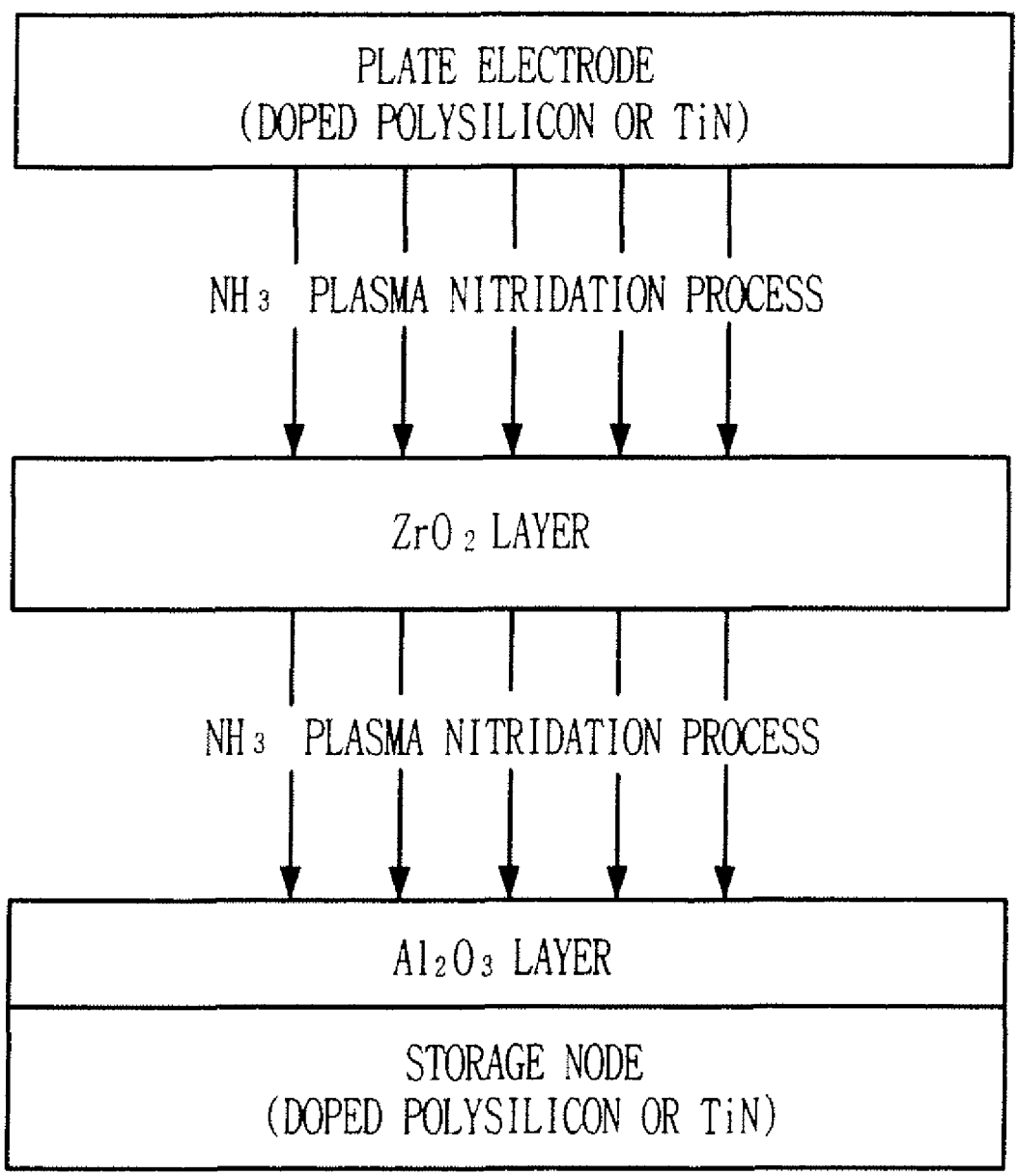
FIG. 9 is a diagram illustrating sequential steps of fabricating a capacitor in accordance with a seventh embodiment of the present invention.

FIG. 9 is a diagram illustrating sequential steps of a method for fabricating a capacitor in accordance with a seventh embodiment of the present invention.

A dual dielectric structure including a nitrided $ZrO_2$ layer and a nitrided $Al_2O_3$ layer is exemplified in the seventh embodiment of the present invention. As illustrated, the $Al_2O_3$ layer is deposited on a storage node including polysilicon or TiN, and an $NH_3$ plasma nitridation process is performed on the $Al_2O_3$ layer. A $ZrO_2$ layer is then formed on the nitrided $Al_2O_3$ layer, and an $NH_3$ plasma nitridation process is performed on the $ZrO_2$ layer, thereby completing the formation of the dual dielectric structure.

Figure 10:
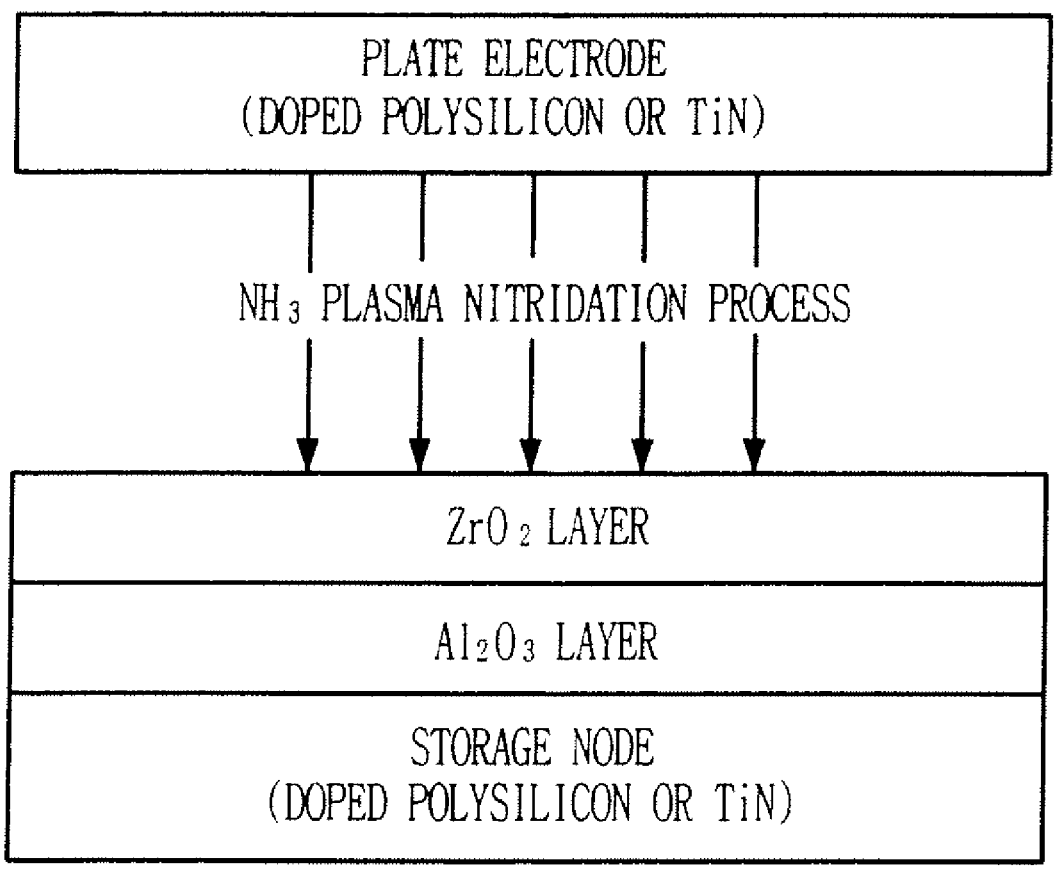
FIG. 10 is a diagram illustrating sequential steps of fabricating a capacitor in accordance with an eighth embodiment of the present invention.

FIG. 10 is a diagram illustrating sequential steps of a method for fabricating a capacitor in accordance with an eighth embodiment of the present invention.

A dual dielectric structure including a nitrided $ZrO_2$ layer and an $Al_2O_3$ layer is exemplified in the eighth embodiment of the present invention. As illustrated, an $Al_2O_3$ layer and a $ZrO_2$ layer are sequentially deposited on a storage node. An $NH_3$ plasma nitridation process is performed on the $ZrO_2$ layer, thereby completing the formation of the dual dielectric structure.

According to the seventh embodiment and the eighth embodiment of the present invention, since the $Al_2O_3$ layer has relatively better thermal stability than the $ZrO_2$ layer, it is expected that the dual dielectric structure including the nitrided $ZrO_2$ layer and the $Al_2O_3$ layer or the nitrided $ZrO_2$ layer and the nitrided $Al_2O_3$ layer has a better leakage current characteristic than the dielectric structure including the single layer of the $ZrO_2$ layer. Particularly, if the subsequent thermal process is performed at above approximately 850° C., as illustrated in FIG. 9, it would be better to perform the $NH_3$ plasma nitridation process on the surface of the $Al_2O_3$ layer prior to depositing the $ZrO_2$ layer. However, if the thermal process is performed at below approximately 850° C., as illustrated in FIG. 10, the $NH_3$ plasma nitridation process can be performed after the $ZrO_2$ layer is deposited without performing the $NH_3$ plasma nitridation process on the $Al_2O_3$ layer. The latter case of forming the dual dielectric structure would be sufficient to provide an intended level of thermal stability to the $ZrO_2$ layer.

Figure 11:
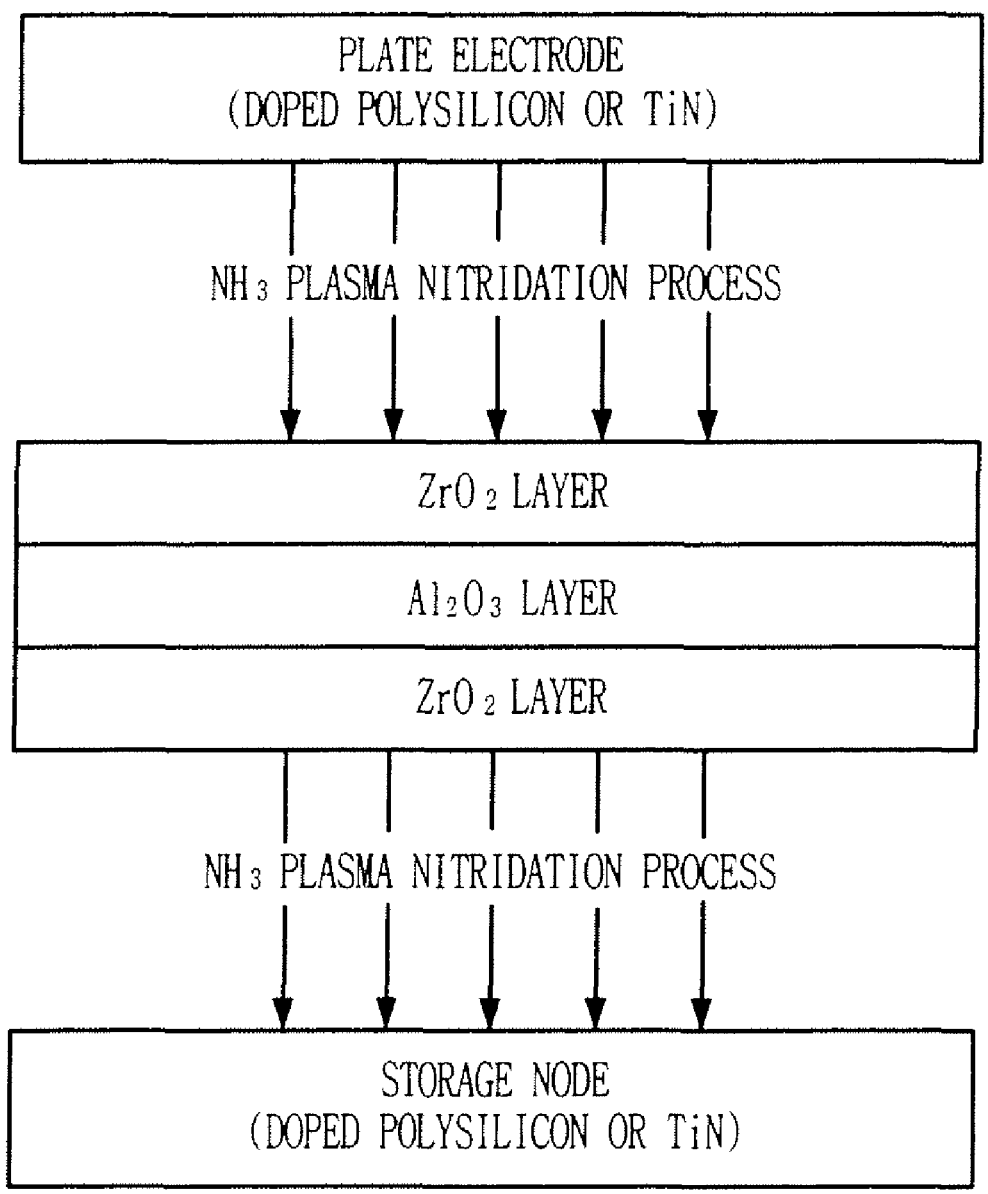
FIG. 11 is a diagram illustrating sequential steps of fabricating a capacitor in accordance with a ninth embodiment of the present invention.

FIG. 11 is a diagram illustrating sequential steps of a method for fabricating a capacitor in accordance with a ninth embodiment of the present invention.

A triple dielectric structure including a $ZrO_2$ layer, an $Al_2O_3$ layer and a nitrided $ZrO_2$ layer is exemplified in the ninth embodiment of the present invention. As illustrated, an $NH_3$ plasma nitridation process is performed on the storage node, and a first $ZrO_2$ layer, an $Al_2O_3$ layer and a second $ZrO_2$ layer are sequentially deposited on the nitrided storage node. The second $ZrO_2$ layer is then subjected to an $NH_3$ plasma nitridation process.

Similar to the formation of the $ZrO_2$ layer, the $Al_2O_3$ layer can be formed through performing one of an ALD method, a MOCVD method and a pulsed CVD method. As for the ALD method, the $Al_2O_3$ deposition includes a unit cycle including: supplying an Al source gas; supplying a purge gas; supplying a reaction gas; and supplying a purge. This unit cycle is repeated until an intended thickness of the $Al_2O_3$ layer is obtained. During the ALD method, the chamber is maintained with a pressure of approximately 0.1 torr to approximately 1 torr along with a relatively low substrate temperature ranging from approximately 200° C. to approximately 500° C.

The Al source gas is selected from the group consisting of $Al(CH_3)_3$, $Al(C_2H_5)_3$ and other Al-containing organic metal compounds and is transported by a carrier gas, e.g., Ar gas. The Ar gas flows in an amount of approximately 20 sccm to approximately 100 sccm for approximately 0.1 seconds to approximately 5 seconds.

The reaction gas is selected from the group consisting of $O_3$, $O_2$ and $H_2O$ vapor, and the purge gas includes $N_2$ gas or Ar gas. The selected $O_3$ gas has a concentration of approximately $200 \pm 20$ gcm$^{-3}$. After the Al source gas flows into the chamber, the purge gas flows in an amount of approximately 50 sccm to approximately 300 sccm for approximately 0.1 seconds to approximately 5 seconds. However, after the reaction gas flows into the chamber, the purge gas flows in an amount of approximately 300 sccm to approximately 1,000 sccm for approximately 0.1 seconds to approximately 10 seconds. The Al source gas flows in an amount of approximately 50 sccm to approximately 500 sccm, and the reaction gas flows in an amount of approximately 0.1 slm to approximately 1 slm for approximately 3 seconds to approximately 10 seconds.

Although the triple dielectric structure including the $ZrO_2$ layer, the $Al_2O_3$ layer and the nitrided $ZrO_2$ layer is exemplified in the ninth embodiment of the present invention, it is still possible to implement a triple dielectric structure including a nitrided $ZrO_2$ layer, an $Al_2O_3$ layer and a nitrided $ZrO_2$ layer or including a nitrided $ZrO_2$ layer, a nitrided $Al_2O_3$ layer and a nitrided $ZrO_2$ layer.

According to the sixth to the ninth embodiments of the present invention, after the $ZrO_2$ layer is deposited, the surface of the $ZrO_2$ layer is subjected to the plasma nitridation process, which induces Zr—O—N bonds by combining nitrogen with the $ZrO_2$ layer. Through this process, the $ZrO_2$ layer has an increased crystallization temperature and an event of impurity diffusion from the plate electrode or storage node to the $ZrO_2$ layer can be blocked.

The capacitor dielectric structure can be formed in a single layer of a nitrided $ZrO_2$ layer, double layers of a nitrided $ZrO_2$ layer and an $Al_2O_3$ layer or triple layers of a $ZrO_2$ layer, an $Al_2O_3$ layer and a nitrided $ZrO_2$ layer. As a result, it is possible to secure a sufficient level of capacitance required by sub-100 nm memory products and improve the leakage current characteristic.

According to the first embodiment to the ninth embodiment of the present invention, a multi-layered dielectric structure is formed. The multi-layered dielectric structure includes a $ZrO_2$ layer, which has a high level of band gap energy of approximately 7.8 eV and a high dielectric constant of approximately 20 to approximately 25, and an $Al_2O_3$ layer, which has good thermal stability, a high level of band gap energy of approximately 8.7 eV and a dielectric constant of approximately 9. Such multi-layered dielectric structure can prevent a generation of undesired leakage current and increase a breakdown voltage. Also, it is possible to secure high capacitance and thus, it is further possible to implement capacitors with a sufficient capacitance level required by sub-70 nm memory products and improved leakage current and breakdown voltage characteristics.

In respect of the fact that the multi-layered dielectric structure has better thermal stability than a conventional dielectric structure including an $HfO_2$ layer, degradation of an electric characteristic can be impeded even if a high temperature process is performed in subsequent integration processes. Therefore, durability and reliability of capacitors can be enhanced even in next generation semiconductor memory devices with metal lines of less than approximately 70 nm.

Also, a $ZrO_2$ layer serving as a dielectric layer of a capacitor is subjected to a plasma nitridation process before and after the $ZrO_2$ deposition for the purpose of inducing Zr—O—N bonds on the $ZrO_2$ layer. The creation of the Zr—O—N bonds increases a crystallization temperature of the $ZrO_2$ layer and prevents an incidence of impurity diffusion from a plate electrode or storage node to the $ZrO_2$ layer, so that an intended level of capacitance and improved leakage current and breakdown voltage characteristics can be obtained.

Also, the capacitor with the $ZrO_2$ layer can lower a frequency of generating leakage current during a high temperature process performed at above approximately 700° C., by approximately 2-fold. Accordingly, durability and reliability of the capacitors in highly integrated semiconductor devices can be improved.

The present application contains subject matter related to the Korean patent application No. KR 2004-0090418 and the Korean patent application No. KR 2005-0057692, filed in the Korean Patent Office on Nov. 8, 2004, and on Jun. 30, 2005, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A capacitor of a semiconductor device, comprising:
    a storage node;
    a multi-layered dielectric structure including a $ZrO_2$ layer and an $Al_2O_3$ layer and formed on the storage node, the ZrO2 layer including a plasma nitrided surface thereon;
    a plate electrode on the multi-layered dielectric structure; and
    a protection layer on the plate electrode.

2. The capacitor of claim 1, wherein the multi-layered dielectric structure has a dual structure of $ZrO_2/Al_2O_3$ obtained by sequentially stacking a $ZrO_2$ layer and an $Al_2O_3$ layer.

3. The capacitor of claim 2, wherein the $ZrO_2$ layer has a thickness of approximately 5 Å to approximately 100 Å and the $Al_2O_3$ layer has a thickness of approximately 5 Å to approximately 30 Å.

4. The capacitor of claim 1, wherein the multi-layered dielectric structure has a dual structure of $Al_2O_3/ZrO_2$ obtained by sequentially stacking an $Al_2O_3$ layer and a $ZrO_2$ layer.

5. The capacitor of claim 4, wherein the $ZrO_2$ layer has a thickness of approximately 5 Å to approximately 100 Å and the $Al_2O_3$ layer has a thickness of approximately 5 Å to approximately 30 Å.

6. The capacitor of claim 1, wherein the multi-layered dielectric structure has a triple structure of $ZrO_2/Al_2O_3/ZrO_2$ obtained by sequentially stacking a first $ZrO_2$ layer, an $Al_2O_3$ layer and a second $ZrO_2$ layer.

7. The capacitor of claim 6, wherein each of the first $ZrO_2$ layer and the second $ZrO_2$ layer has a thickness of approximately 5 Å to approximately 50 Å and the $Al_2O_3$ layer has a thickness of approximately 5 Å to approximately 15 Å.

8. The capacitor of claim 1, wherein the multi-layered dielectric structure has a multi-layered structure of $(ZrO_2/Al_2O_3)n$ obtained by forming the $Al_2O_3$ layer and the $ZrO_2$ layer alternately at least more than two times.

9. The capacitor of claim 8, wherein the $ZrO_2$ layer has a thickness of approximately 5 Å to approximately 25 Å, and the $Al_2O_3$ layer has a thickness of approximately 5 Å to approximately 10 Å.

10. The capacitor of claim 8, wherein 'n' is in a range of a value greater than or equal to approximately 2 and less than or equal to approximately 10.

11. The capacitor of claim 1, wherein the multi-layered dielectric structure has a multi-layered structure of $(Al_2O_3/ZrO_2)n$ obtained by forming the $ZrO_2$ layer and the $Al_2O_3$ layer alternately at least more than two times.

12. The capacitor of claim 11, wherein the $ZrO_2$ layer has a thickness of approximately 5 Å to approximately 25 Å, and the $Al_2O_3$ layer has a thickness of approximately 5 Å to approximately 10 Å.

13. The capacitor of claim 11, wherein 'n' is in a range of a value greater than or equal to approximately 2 and less than or equal to approximately 10.

14. The capacitor of claim 1, wherein the protection layer is formed with one of an oxide layer including a material selected from the group consisting of $Al_2O_3$, hafnium oxide ($HfO_2$), tantalum oxide ($Ta_2O_5$), $ZrO_2$, titanium oxide ($TiO_2$), and lanthanum oxide ($La_2O_3$) and a metal layer including TiN and has a thickness of approximately 50 Å to approximately 200 Å.

15. A capacitor of a semiconductor device, comprising:
    a storage node;
    an $Al_2O_3$ layer formed on the storage node;
    a $ZrO_2$ layer formed on the $Al_2O_3$ layer and including a plasma nitrided surface; and
    a plate electrode formed on the $ZrO_2$ layer.

16. A capacitor of a semiconductor device, comprising:
    a storage node;
    an $Al_2O_3$ layer including a plasma nitrided surface and formed on the storage node;
    a $ZrO_2$ layer formed on the $Al_2O_3$ layer and including a plasma nitrided surface; and
    a plate electrode formed on the $ZrO_2$ layer.

17. A capacitor of a semiconductor device, comprising:
    a storage node;
    a dual structure including an $Al_2O_3$ layer of which surface is plasma nitrided and a first $ZrO_2$ layer of which surface is plasma nitrided and formed on the storage node;
    a second $ZrO_2$ layer formed on the dual structure and including a plasma nitrided surface; and
    a plate electrode formed on the second $ZrO_2$ layer.

18. A capacitor of a semiconductor device, comprising:
    a storage node;
    a dual structure including an $Al_2O_3$ layer and a first $ZrO_2$ layer of which surface is plasma nitrided and formed on the storage node;
    a second $ZrO_2$ layer formed on the dual structure and including a plasma nitrided surface; and
    a plate electrode formed on the second $ZrO_2$ layer.

19. A capacitor of a semiconductor device, comprising:
    a storage node;
    a dual structure including an $Al_2O_3$ layer and a first $ZrO_2$ layer and formed on the storage node;
    a second $ZrO_2$ layer formed on the dual structure and including a plasma nitrided surface; and
    a plate electrode formed on the second $ZrO_2$ layer,
    wherein the dual structure and second $ZrO_2$ layer form a triple structure of $ZrO_2/Al_2O_3/ZrO_2$.

20. The capacitor of claim 19, wherein a surface of the storage node is plasma nitrided.

* * * * *